United States Patent [19]

Farkas

[11] 3,708,760

[45] Jan. 2, 1973

[54] AVALANCHE BREAKDOWN SINUSOIDAL OSCILLATOR

[76] Inventor: Zoltan D. Farkas, 854 Coleman Avenue, Menlo Park, Calif. 94025

[22] Filed: Dec. 24, 1970

[21] Appl. No.: 101,355

[52] U.S. Cl. ............... 331/107 R, 331/138, 331/165, 331/167

[51] Int. Cl. ............... H03b 11/10

[58] Field of Search ......331/107 R, 110, 138, 117 R, 331/165, 167, 168, 128; 307/324

[56] References Cited

UNITED STATES PATENTS 2,997,604 8/1961 Shockley ......................... 331/107 X

FOREIGN PATENTS OR APPLICATIONS 723,778 12/1965 Canada ............................... 331/107

OTHER PUBLICATIONS

Thompson, "An Audio-Frequency High-Power Generator Employing Silicon Controlled Rectifiers," The Institution of Electrical Engineers, May 1962, pp. 249-258

*Primary Examiner*—Robert Segal
*Assistant Examiner*—Siegfried H. Grimm
*Attorney*—Townsend and Townsend

[57] ABSTRACT

A sinusoidal oscillator having a resonant path, a direct current voltage source, and two or more two-terminal, active devices, such as pnpn diodes, that break down and conduct when a characteristic voltage is reached. Such devices, when oscillating is established, conduct on alternate half-cycles. When a device breaks down, it becomes a low resistance and an oscillation will be established for a half a period. During this time, the voltage across the other device is less than its breakdown voltage. At the end of the half-period, the first device becomes back-biased and conduction through it ceases. Then, the second device breaks down and conducts for a half-cycle. The two devices continue thereafter to conduct on alternate half-periods so that substantially continuous, sinusoidal oscillations are established, and are sustained by the direct current source.

5 Claims, 3 Drawing Figures

PATENTED JAN 2 1973 3,708,760

INVENTOR.
ZOLTAN D. FARKAS
BY
Townsend and Townsend
ATTORNEYS

AVALANCHE BREAKDOWN SINUSOIDAL OSCILLATOR

This invention relates to improvements in electronic oscillators and, more particularly, to an improved oscillator utilizing the relaxation principle of operation.

Conventional sinusoidal oscillators below UHF generally utilize three terminal devices, namely, an input, an output and a common. Such an oscillator essentially defines an amplifier utilizing feedback from the output terminal to the input terminal. Moreover, conventional oscillators with two-terminal, active devices do not have a sinusoidal output.

The present invention is directed to an improved, nearly 100 percent efficient, sinusoidal oscillator which does produce an output sine wave using only two-terminal, active devices. Such devices are of the type which hold off conduction therethrough until a characteristic breakdown voltage is reached. While several different types of devices may meet this criterion, pnpn diodes are especially suitable for this purpose since they conduct in a forward direction when a predetermined forward breakdown voltage is reached.

The oscillator of this invention is constructed so that the two-terminal, active devices are in respective circuit loops. The oscillator also has means defining a resonant path, such as an RLC assembly, an open-circuited delay line or a transmission line. The devices conduct through the resonant path during alternate half-cycles of each period and, once oscillations begin, such oscillations are continuous thereafter until one of the circuits is opened.

Assuming that the resonant path of the invention is oscillating, the oscillations will normally damp out. However, the voltage source in the oscillator of the present invention is arranged so that the oscillating current is made to pass through a rise in potential due to the voltage source; thus, the oscillations will be sustained indefinitely and the energy delivered by the voltage source will be equal to the energy dissipated in the resistance of the resonant path. If the energy delivered by this voltage source is greater than or less than the power dissipated in the resonant path, then the current will rise or lower until the above-indicated equilibrium condition is established. The differential equation describing the oscillations does not depend upon the voltage source itself.

Other embodiments of the oscillator of this invention can be utilized. For instance, the circuits containing the two-terminal, active devices mentioned above can be replaced by a circuit containing four such devices arranged in a manner to appear as a bridge rectifier in reverse. In such a case, the resonant path will replace the a-c generator of the bridge rectifier analogy and the unidirectional voltage source will replace the load across which the inverted d-c voltage appears in the same analogy. The polarity of the unidirectional voltage source has to be opposite to the polarity of the load voltage that was replaced. This is because the resonant path now accepts power; whereas, the a-c generator, which the resonant path replaced, actually delivered the power. In a bridge rectifier circuit, the diodes are forwardly biased and ordinarily would operate to short-circuit the d-c source. This is remedied by replacing the diodes with pnpn diodes. This will enable only one set of active devices to conduct at any one time so as not to short-circuit the d-c voltage source.

The primary object of this invention is to provide an improved sinusoidal oscillator which operates on the relaxation principle with the use of two-terminal, active devices arranged in respective circuits so that the devices conduct on alternate half-cycles of each period and produce a sine wave output while assuring that sustained oscillations will be achieved once the circuits commence to oscillate.

Another object of this invention is to provide an oscillator of the type described which utilizes a resonant path which is common to two different circuits with each circuit containing a two-terminal, active device capable of conducting when a characteristic breakdown voltage is reached whereupon the oscillations through the resonant path due to both devices, one or the other device conducting during each half-period, occur during alternate half-cycles of each period and the voltage source operates to sustain the oscillations by supplying the power dissipated in the resistance of the resonant path during the oscillations of the various half-cycles.

Another object of this invention is to provide an oscillator which is nearly 100 percent efficient.

Another object of this invention is to provide a means of generating a high voltage from a low voltage source using active components rated well below the generated high voltage.

Other objects of this invention will become apparent as the following specification progresses, reference being had to the accompanying drawing for an illustration of several embodiments of the oscillator.

Figure 1:
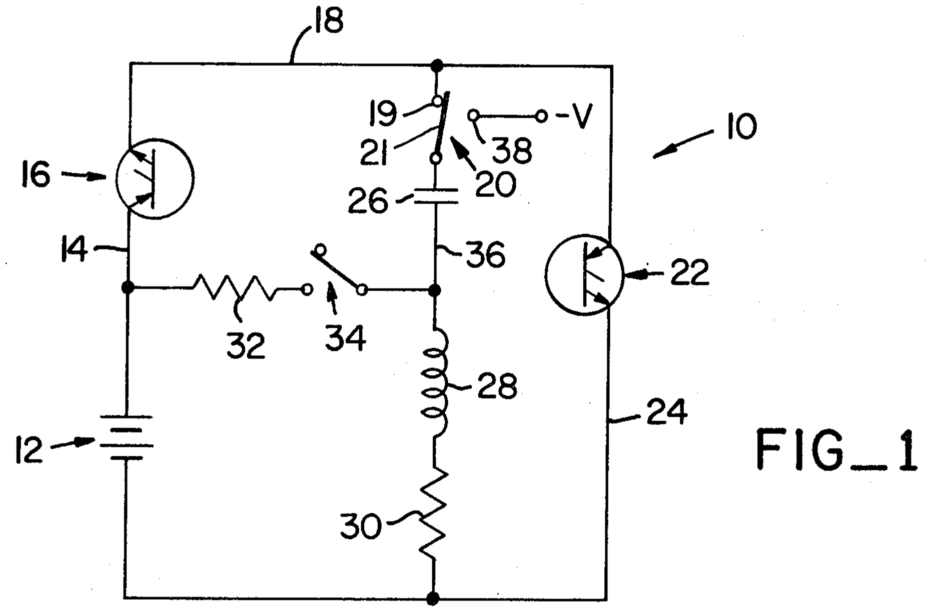
FIG. 1 is a schematic diagram of one form of the oscillator of this invention.

One form of the oscillator of the present invention is denoted by the numeral 10 and includes a number of circuit components as shown in FIG. 1. The positive terminal of a d-c voltage source 12 is coupled by a lead 14 to the anode of a pnpn diode 16 and the cathode of the diode 16 is coupled by a lead 18 to a first fixed contact 19 of a switch 20 and the anode of a second pnpn diode 22. The cathode of diode 22 is coupled by a lead 24 to the negative terminal of source 12. Switch 20 is in series relationship with a series resonant assembly including a capacitor 26, an inductor 28 and a resistor 30, the latter being coupled to lead 24.

Switch 20 is needed only for initiating oscillation ("-priming") and its shiftable arm 21 engages contact 19 during oscillation. A priming path is provided by the other fixed contact 38 of switch 20, contact 38 being adapted for connection to a source of negative voltage to effect charging of capacitor 26 to a voltage which will be in series aiding with the voltage of source 12, the sum of the two voltages being of sufficient magnitude to break down the pnpn diode 16. Another possible "-priming" path for initiating oscillations by means of an initial current flow through inductor 28 with the aid of source 12 includes a resistor 32 connected to lead 14 and in series with a switch 34, the latter being connected to lead 36 which interconnects capacitor 26 and inductor 28.

The operation of oscillator 10 is as follows:

Assuming as an initial condition that capacitor 26 is charged to a voltage which is in series aiding with the voltage of source 12, and the sum of these two voltages is equal to or greater than the breakdown voltage of diode 16. The capacitor can be charged by shifting arm 21 of switch 20 into engagement with contact 38 which is connected, it is assumed, to an external source of negative voltage.

Arm 21 of switch 20 is then shifted into engagement with contact 19. Diode 16 would breakdown instantaneously if it were an infinite resistor in its blocking state. Practically, however, the voltage across diode 16, which is in its blocking state and is equivalent to a large resistor, rises in accordance with the behavior of an over-damped series RLC circuit with an initial charge on the capacitor until it reaches the breakdown voltage of diode 16. In any case, the time required to effect breakdown is a small fraction of a half-period of oscillation. At this point, diode 16 breaks down and becomes a low resistance and the RLC path will oscillate for a half-period.

During this half-period in which diode 16 conducts, the voltage across diode 22, which is equal to the voltage of source 12 minus the small voltage drop across pnpn diode 16, is less than the forward breakdown voltage of diode 22; therefore, diode 22 will be essentially an open circuit. The voltage across capacitor 26 which is greater than the pnpn diode breakdown voltage is balanced by the $L(di/dt)$ voltage drop across inductor 28. At the end of this half-period, both the current and the rate of change of current will cease and the capacitor voltage is reversed and is of a higher amplitude. Diode 16 thus reverts to its blocking state.

At this instant, the positive voltage across diode 22 rises in accordance with the behavior of an overdamped RLC circuit until the forward blocking voltage of diode 22 is reached. This will occur when diode 16 has ceased to conduct or shortly thereafter. When it occurs, diode 22 breaks down and becomes a low resistance, thus causing conduction therethrough for the next half-period. At the end of the last-mentioned half-period the original initial conditions are again established except that the voltage across capacitor 26 is higher and diode 16 will break down as before to cause an oscillation for the third half-period and so on. The oscillations continue to build up to higher amplitudes until an equilibrium is established between the energy delivered by the battery and the energy dissipated in resistor 30. In this way, diodes 16 and 22 conduct on alternate half-periods so that continuous oscillations are established.

The time interval from the end of the conducting state of one diode to the beginning of the conducting state of the other diodes is, at worst, only a small fraction of the period. During oscillation, the voltage across capacitor 26 is balanced by the voltage across the inductor. The voltage across the RLC path does not reach the value of the reverse breakdown voltage of either diode because the forward breakdown characteristics of the diodes are reached sooner.

Figure 2:
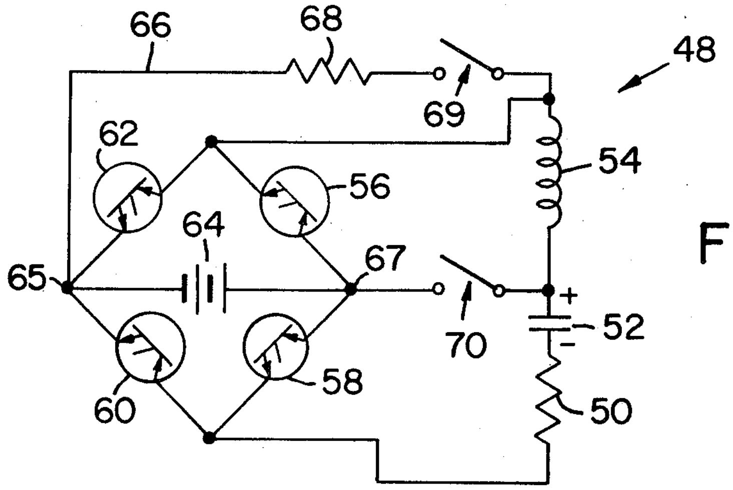
FIG. 2 is a schematic diagram of a second form of the oscillator.
Figure 3:
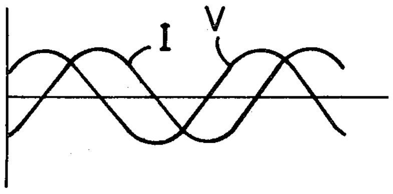
FIG. 3 is a graphic view of the waveforms for voltage across the capacitor of the resonant path and current through the resonant path characterizing the operation of the oscillator of this invention.

A second embodiment of the oscillator of this invention is shown in FIG. 2 and is denoted by the numeral 48. It has a number of pnpn diodes connected together in a manner which appears to provide a bridge rectifier in reverse. The a-c generator normally used with such a rectifier is replaced by an RLC assembly comprised of a resistor 50, a capacitor 52, and an inductor 54. Four pnpn diodes 56, 58, 60 and 62 are coupled together in the manner shown in FIG. 2. The negative terminal of a d-c source 64 is connected to the junction 65 between the cathodes of diodes 60 and 62 and the positive terminal of source 64 is connected to the junction 67 between the anodes of diodes 56 and 58. A lead 66 connects junction 65 with a resistor 68 and a switch 69 and one end of inductor 54. A second switch 70 connects junction 67 with the other end of inductor 54.

The polarity of source 64 must be opposite to the polarity of the load voltage of the bridge rectifier analogy because the resonant RLC path now has to accept power; whereas, in the bridge rectifier analogy, the a-c generator delivers power. In the embodiment of FIG. 2, the diodes become forward biased and would, if they were ordinary diodes, short-circuit source 64. This is remedied, however, by utilizing pnpn diodes.

The oscillator of FIG. 2 operates in a manner similar to the operation of the embodiment of FIG. 1. During each half-period, a pair of diodes will conduct and will complete a circuit loop comprised of source 64 in series with the series resonant RLC path defined by resistor 50, capacitor 52 and inductor 54. To initiate an oscillation for the first half-period, the voltage across each of the diodes 56 and 60 must be equal to or greater than their forward breakdown voltages. When breakdown occurs, conduction is established through diodes 56 and 60, source 64 and the RLC path. During this first half-period, the voltage across the series RLC path is the source voltage minus the small voltage drop across the conducting pnpn diodes 56 and 60. The voltage across C being balanced by the opposite voltage across L. The voltage across diode 58 is the source voltage minus the voltage drop across diode 60 and the voltage across diode 62 is the source voltage minus the voltage drop across diode 56. Therefore, the voltage across each of diodes 58 and 62 is insufficient for breakdown; thus, both diodes 58 and 62 remain in an open-circuit condition during this half-period.

At the end of this first half-period, the capacitor voltage is reversed and of a higher amplitude. At this time, the voltages across each of diodes 58 and 62 will increase rapidly until their forward breakdown voltages are reached. This occurs at the time when conduction through diodes 56 and 60 ceases or shortly thereafter. When the forward breakdown voltages of diodes 58 and 62 are reached, they break down and conduct through source 64 and the RLC path during the second half-period, the current flow through the RLC path being in the opposite direction to the current which flows therethrough when diodes 56 and 60 are conducting. During this second half-period, the voltage across diode 56 equals the source voltage minus the voltage drop across diode 58, and the voltage across diode 60 equals the source voltage minus the voltage drop across diode 62; thus, diodes 56 and 60 are in their open-circuit conditions. At the end of the second half-period when the current is zero, diodes 58 and 62 will cease to conduct, the rate of change of current will also be zero, and the now reversed capacitor voltage is applied to the series combination of inductor 54, diodes 56 and 60, and voltage source 64. Thus, diodes 56 and 60 will break down and will conduct for the next half-period. This occurs when conduction ceases through diodes 58 and 62 or shortly thereafter. In this way, the pairs of diodes conduct alternately in respective half-periods so that sustained oscillations are established.

Oscillator 48 is not self-starting. Sufficient energy must be introduced into the RLC circuit to raise the voltage to a value greater than the forward breakdown voltage of each of the four diodes. This is necessary because the magnitude of the voltage source 64 must be less than the forward breakdown voltage of a pair of pnpn diodes connected in series. A means of initiating oscillations is shown in FIG. 2. Switches 69 and 70 are closed momentarily until a given current flows through the current limiting resistor 68 and inductor 54. As the two switches are opened, the inertia of the current in the inductor will break down diodes 56 and 60 and oscillations will commence.

When a series RLC path is oscillating, the oscillations ordinarily damp out. However, if the oscillating current through such a path is made to pass through a rise in potential at every half-cycle or at every second half-cycle or even less frequently, then the oscillations will be sustained indefinitely and the energy delivered due to the potential rise is equal to the energy dissipated in the resistance of the RLC path. Oscillators 10 and 48, when in operation, follow this same principle. The voltage source provides the potential rise and the energy supplied by it equals the energy dissipated due to current flow through resistor 30. Moreover, if the energy delivered by the source is greater or less than the energy dissipated in the resistor, then the current will rise or fall until the above-indicated equilibrium condition is established. In both embodiments, current flows always into the negative terminal of the voltage source and out of the positive terminal thereof so that the voltage source always delivers energy and never takes energy.

Diodes suitable for use in the two embodiments can, for instance, be Motorola M4L3052 pnpn diodes. They have a forward breakdown voltage of 8 volts and a reverse breakdown voltage of 15 volts. However, any other suitable device which inhibits conduction and up to a given voltage and then conducts strongly with little voltage drop across it can be used. Also, the reverse voltage breakdown must be greater than the forward voltage breakdown. The last property can always be implemented by placing a diode in series with the active element.

Other forms of the invention include placing another voltage source with the proper polarity in series with diode 16 or by replacing the series resonant RLC path with an open-circuited delay line or transmission line.

I claim:

1. A sinusoidal oscillator comprising: a first pair of pnpn diodes; a second pair of pnpn diodes, each diode having a forward breakdown voltage and a reverse breakdown voltage greater than its forward breakdown voltage; a d-c voltage source having an emf less than the forward breakdown voltage of each diode; and a resonant assembly, the pnpn diodes being arranged in a bridge circuit having a pair of current paths, the voltage source and the resonant assembly being in series with each of said current paths such that the current flows through the voltage source in the same direction during both half-cycles of a period as the current flows through the resonant assembly in one direction during the first half-cycle of the period and in the opposite direction during the second half-cycle of the period, each pair of diodes being conductive during a respective half-cycle of the period.

2. An oscillator as set forth in claim 1, wherein is included means to introduce an initial current through the inductor to initiate an oscillation.

3. An oscillator as set forth in claim 1, wherein the assembly includes a series RLC resonant circuit.

4. A sinusoidal oscillator comprising: a pair of two-terminal, active devices, each device having a characteristic voltage at which it breaks down and conducts in a forward direction; a d-c voltage source; means defining a resonant path, one of said devices being connected in series with the voltage source, said one device and said voltage source being coupled across the resonant path to form a first closed circuit loop, the other device being connected across the resonant path to form a second, closed circuit loop, the current through the resonant path being in one direction in the first loop during a first half-cycle of a period and in the opposite direction in the second loop during the second half-cycle of a period, each of said devices automatically become non-conductive at the end of the corresponding half-cycle and become conductive as required for oscillation at the end of the half-cycle in which the other device has been conductive; and a switch in series with said defining means and adapted to connect the same to an external voltage source to effect initiation of oscillations.

5. An oscillator as set forth in claim 4, wherein said defining means includes an inductor, and wherein is included means forming a current flow path from the voltage source to said inductor to permit an initial current to flow through the inductor to initiate an oscillation.

* * * * *